(12) United States Patent
Wang et al.

(10) Patent No.: US 10,955,880 B2
(45) Date of Patent: Mar. 23, 2021

(54) FOLDING ELECTRONIC DEVICES WITH GEARED HINGES

(71) Applicant: Apple Inc., Cupertino, CA (US)

(72) Inventors: Kai Wang, San Jose, CA (US); Zhiyong Cedric Xia, San Jose, CA (US); Michael B. Wittenberg, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/849,830

(22) Filed: Apr. 15, 2020

(65) Prior Publication Data

US 2020/0409428 A1    Dec. 31, 2020

Related U.S. Application Data

(60) Provisional application No. 62/868,590, filed on Jun. 28, 2019.

(51) Int. Cl.
*G06F 1/16* (2006.01)
*H05K 5/02* (2006.01)
*H05K 5/00* (2006.01)

(52) U.S. Cl.
CPC .......... *G06F 1/1681* (2013.01); *G06F 1/1616* (2013.01); *G06F 1/1652* (2013.01); *H05K 5/0017* (2013.01); *H05K 5/0226* (2013.01)

(58) Field of Classification Search
CPC combination set(s) only.
See application file for complete search history.

(56) References Cited

U.S. PATENT DOCUMENTS

| | | | |
|---|---|---|---|
| 5,864,320 A | 1/1999 | Baghdasarian | |
| 6,926,546 B2 | 8/2005 | Kurokawa | |
| 9,047,055 B2 | 6/2015 | Song | |
| 9,071,673 B2 | 6/2015 | Choi et al. | |
| 9,348,450 B1 * | 5/2016 | Kim | G06F 3/0412 |
| 9,504,170 B2 | 11/2016 | Rothkopf et al. | |
| 9,848,502 B1 * | 12/2017 | Chu | E05D 11/1078 |
| 10,890,949 B2 * | 1/2021 | Ou | G06F 1/1652 |
| 2006/0022955 A1 | 2/2006 | Kennedy | |
| 2009/0046110 A1 | 2/2009 | Sadler et al. | |
| 2015/0233162 A1 | 8/2015 | Lee et al. | |

(Continued)

FOREIGN PATENT DOCUMENTS

| | | |
|---|---|---|
| EP | 1939470 A1 | 7/2008 |
| EP | 3489795 A1 | 5/2019 |

*Primary Examiner* — Lisa Lea-Edmonds
(74) *Attorney, Agent, or Firm* — Treyz Law Group, P.C.; G. Victor Treyz; Matthew R. Williams

(57) ABSTRACT

An electronic device has a foldable display. First and second portions of an electronic device housing for the device may be joined using a hinge. A flexible display may overlap the first housing portion and the second housing portion and may bend along a bend axis as the first and second housing portions are rotated relative to each other using the hinge. The hinge may include toothed members such as gears and a rack member. The rack member may have a surface with curved portions. The gears may include rotating gears that walk along the curved portions of the rack member as the electronic device is folded and unfolded. The hinge may include gears that are fixedly attached to the first and second housing portions and that engage the rotating gears. Linkage members may hold together gears and the rack member.

22 Claims, 10 Drawing Sheets

(56) References Cited

U.S. PATENT DOCUMENTS

| | | | | |
|---|---|---|---|---|
| 2017/0227994 A1* | 8/2017 | Hsu | ................... | G06F 1/1652 |
| 2017/0235337 A1* | 8/2017 | Vic | ................... | E05D 11/00 |
| | | | | 361/679.55 |
| 2018/0335679 A1* | 11/2018 | Hashimoto | ......... | G02F 1/13338 |
| 2020/0117245 A1* | 4/2020 | Ou | ................... | H04M 1/0268 |
| 2020/0166974 A1* | 5/2020 | Ai | ................... | G06F 1/1641 |
| 2020/0352044 A1* | 11/2020 | Hsu | ................... | H05K 7/1401 |
| 2020/0371564 A1* | 11/2020 | Kim | ................... | H05K 5/0226 |
| 2020/0375046 A1* | 11/2020 | Sim | ................... | H05K 5/0226 |
| 2020/0383215 A1* | 12/2020 | Kim | ................... | H05K 5/0017 |
| 2020/0383219 A1* | 12/2020 | Hale | ................... | E05D 3/122 |
| 2020/0409427 A1* | 12/2020 | Hsu | ................... | E05D 11/082 |

\* cited by examiner

FOLDING ELECTRONIC DEVICES WITH GEARED HINGES

This application claims the benefit of provisional patent application No. 62/868,590, filed Jun. 28, 2019, which is hereby incorporated by reference herein in its entirety.

FIELD

This relates generally to electronic devices, and, more particularly, to electronic devices with displays.

BACKGROUND

Electronic devices often include displays. A touch screen display may be used in a cellular telephone or other portable device to display information for a user and to gather user input.

If care is not taken, a display may not offer sufficient screen real estate to display information of interest to a user. At the same time, it can be difficult to enlarge the size of electronic devices too much to accommodate larger displays, because this can make devices bulky.

SUMMARY

An electronic device may have a foldable display. A foldable housing or other support structure may be used in supporting the foldable display during folding and unfolding. First and second support structures may be joined at a hinge. The hinge allows the support structures to rotate relative to each other during folding and unfolding.

The hinge may include toothed members such as gears and a rack member. The rack member may have a surface with curved portions. The gears may include rotating gears that walk along the curved portions of the rack member as the electronic device is folded and unfolded. The hinge may include gears that are fixedly attached to the first and second housing portions and that engage the rotating gears. Linkage members may hold together the rotating gears, fixed gears, and the rack member.

DETAILED DESCRIPTION

An electronic device may have a display. The display may have an array of pixels for displaying images for a user. The display may be an organic light-emitting diode display, a micro-light-emitting diode display formed from an array of crystalline semiconductor light-emitting diode dies, and/or may be any other suitable display. A two-dimensional touch sensor such as a capacitive touch sensor or other touch sensor may be incorporated into the display (e.g., by forming capacitive sensor electrodes from thin-film display circuitry) and/or a touch sensor layer may be laminated to an array of pixels in the display.

The display of the electronic device may be operated in unexpanded and expanded configurations. In the unexpanded configuration, portability of the device is enhanced. In the expanded configuration, viewable display area is increased, making it easier to provide touch input and to view images on the display.

Figure 1:
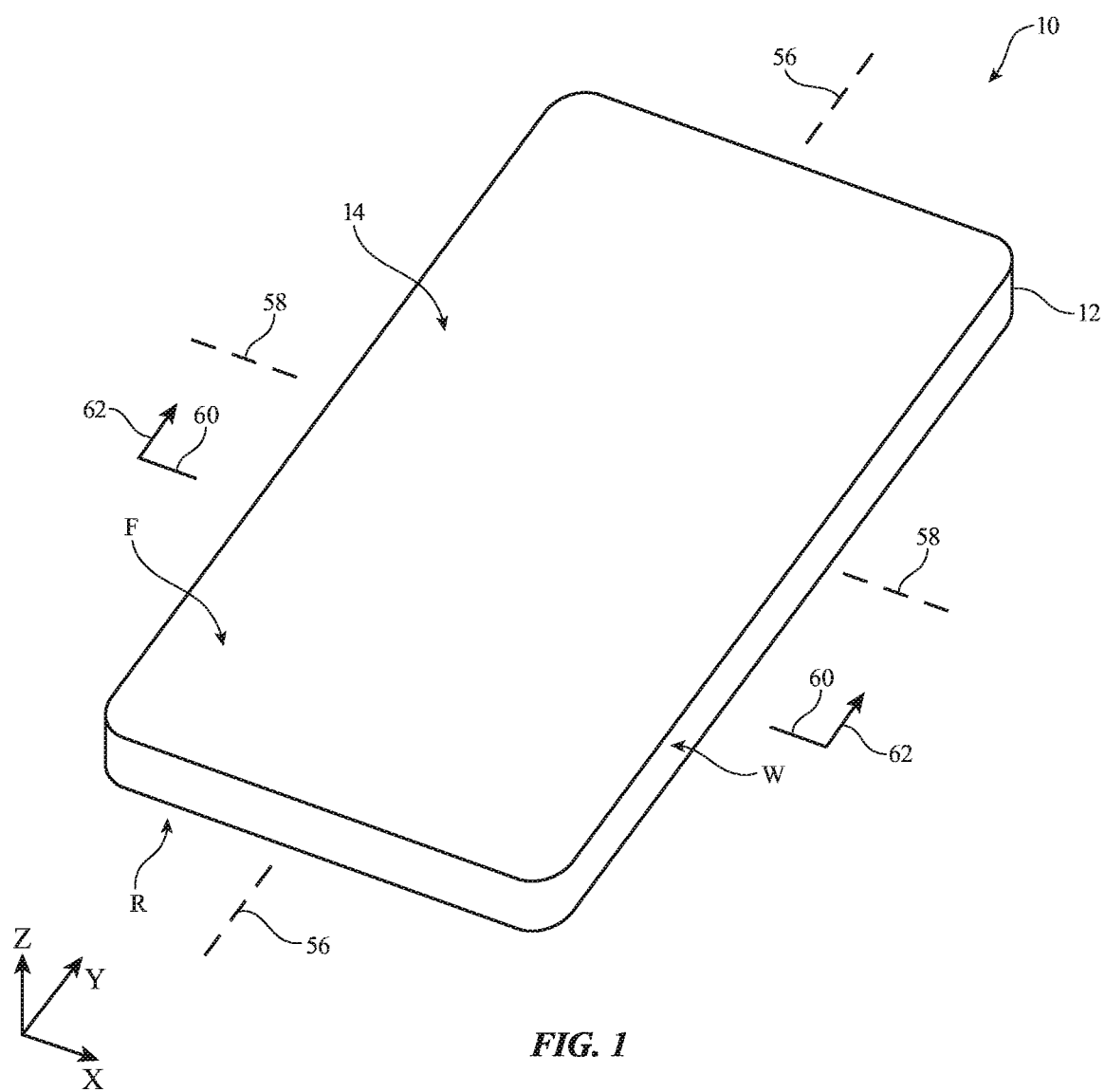
FIG. 1 is a perspective view of an illustrative electronic device in accordance with an embodiment.

A perspective view of an illustrative electronic device of the type that may include an expandable display is shown in FIG. 1. Device 10 may be a laptop computer, a computer monitor containing an embedded computer, a tablet computer, a desktop computer, a cellular telephone, a media player, or other handheld or portable electronic device, a smaller device such as a wristwatch device, a wristband device, a pendant device, a headphone or earpiece device, a head-mounted device such as glasses, goggles, a helmet, or other equipment worn on a user's head, or other wearable or miniature device, a television, a computer display that does not contain an embedded computer, a gaming device, a navigation device, an embedded system such as a system in which equipment is mounted in a kiosk, in an automobile, airplane, or other vehicle, a removable external case for electronic equipment, an accessory such as a remote control, computer mouse, track pad, wireless or wired keyboard, or other accessory, and/or equipment that implements the functionality of two or more of these devices. In the illustrative configuration of FIG. 1, device 10 is a portable electronic device such as a cellular telephone or tablet computer. This configuration may sometimes be described herein as an example.

As shown in FIG. 1, device 10 may have a housing such as housing 12. Housing 12 may be formed from materials such as polymer, glass, metal, crystalline materials such as sapphire, ceramic, fabric, foam, wood, other materials, and/or combinations of these materials. Device 10 may have any suitable shape. In the example of FIG. 1, device 10 has front face F with a rectangular outline, opposing rear face R, and sidewall portions (sidewalls) W. Portions W may be formed as extensions of the housing structures on front face F, rear face R, and/or may be formed using one or more separate sidewall members (as examples). Sidewall structures may be planar (e.g., to form vertical sidewalls extending between front F and rear R) and/or may have curved cross-sectional profiles. Input-output devices such as one or more buttons may be mounted on housing 12 (e.g., on sidewall portions W).

Device 10 may have one or more displays such as display 14. In the example of FIG. 1, display 14 covers front face F. Display 14 may also be mounted on other portions of device 10. For example, one or more displays such as display 14 may cover all of front face F, part of front face F, some or all of rear face R, and/or some or all of sidewalls W. Portions of housing 12 (e.g., support structures such as first and second housing portions that rotate relative to each other) may be used in supporting display 14. Housing 12 may include outwardly facing structures that form external device surfaces and/or may include frame structures, supporting plates, and/or other internal support structures. In some configurations, some or all of display 14 may be covered with flexible or rigid transparent members that serve as protective display cover layers. Such transparent display cover layer structures, which may sometimes be referred to as housing structures, may overlap at least some of display 14 and may serve as a display cover layer. If desired, transparent thin-film structures may serve as protective display layers (e.g., scratch-resistance layers, oleophobic anti-smudge coating layers, etc.).

Display 14 may have a planar shape, a shape with a curved cross-sectional profile, or other suitable shape. In the example of FIG. 1, front face F has a planar shape and lies in the X-Y plane. Display 14 may have a rectangular footprint (outline when viewed from above) or other suitable footprint. Device 10 may be elongated along longitudinal axis 56 (e.g., parallel to the Y axis of FIG. 1) or along other directions (e.g., parallel to the X axis of FIG. 1). The thickness of device 10 in dimension Z, may be less than the width of device 10 in dimension X and less than the length of device 10 in dimension Y (as an example).

To help accommodate a user's desire for compactness while accommodating a user's desire for large amounts of display real estate, device 10 can have structures that allow the shape and size of device 10 and display 14 to be adjusted. In particular, device 10 may have a display and associated housing structures that support folding motions, sliding motions, scrolling motions, and/or other behavior that allows device 10 to be adjusted during use.

When expanded, display 14 exhibits an expanded viewable area. In particular, the portion of display 14 that is viewable by a user of device 10 when device 10 is expanded (sometimes referred to as the expanded viewable area of display 14) is larger than the unexpanded viewable area of display 14 that is presented to a user of device 10 when device 10 is unexpanded. In general, device 10 may use any suitable arrangement that allows display and/or device size and/or shape to be adjusted (e.g., between a first configuration such as an unexpanded viewable area configuration in which a first amount of display 14 is visible to a user viewing the front face of device 10 or other side of device 10 and a second configuration such as an expanded viewable area configuration in which a second amount of display 14 that is greater than the first amount is visible to a user viewing the front face of device 10 or other side of device 10). These arrangements may exhibit inward and/or outward folding, scrolling, sliding, and/or other housing and display movements as device 10 and display 14 are transitioned between unexpanded and expanded states. Illustrative configurations in which device 10 is expanded and unexpanded using folding mechanisms are described herein as an example.

When compact size is desired in a folding configuration, device 10 can be adjusted to be compact by folding portions of device 10 together. Device 10 and display 14 may, as an example, be folded inwardly and/or outwardly about bend axis 58. In inwardly folding configurations, two halves of display 14 face each other when device 10 is folded. In outwardly folding configurations, two halves of display 14 face away from each other when device 10 is folded. When a large screen size is desired, device 10 and display 14 can be unfolded.

Figure 2:
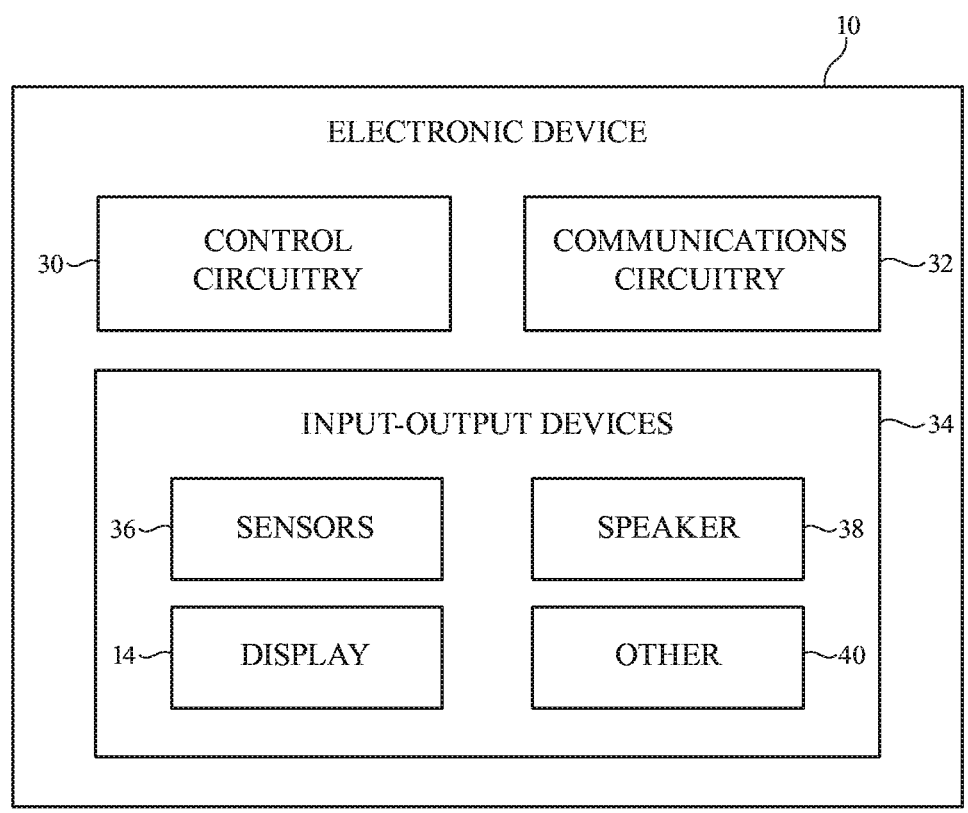
FIG. 2 is a schematic diagram of an illustrative electronic device in accordance with an embodiment.

A schematic diagram of an illustrative electronic device is shown in FIG. 2. As shown in FIG. 2, device 10 may include control circuitry 30, communications circuitry 32, and input-output devices 34.

Control circuitry 30 may include storage and processing circuitry for supporting the operation of device 10. The storage and processing circuitry may include storage such as nonvolatile memory (e.g., flash memory or other electri-cally-programmable-read-only memory configured to form a solid-state drive), volatile memory (e.g., static or dynamic random-access-memory), etc. Processing circuitry in control circuitry 30 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external electronic equipment, control circuitry 30 may communicate using communications circuitry 32. Communications circuitry 32 may include antennas, radio-frequency transceiver circuitry, and other wireless communications circuitry and/or wired communications circuitry. Circuitry 32, which may sometimes be referred to as control circuitry and/or control and communications circuitry, may, for example, support wireless communications using wireless local area network links, near-field communications links, cellular telephone links, millimeter wave links, and/or other wireless communications paths.

Input-output devices 34 may be used in gathering user input, in gathering information on the environment surrounding the user, and/or in providing a user with output.

Display 14 of input-output devices 34 has an array of pixels for displaying images to users. Display 14 may be a light-emitting diode display (e.g., an organic light-emitting diode or a display with a pixel array having light-emitting diodes formed from crystalline semiconductor dies), an electrophoretic display, a liquid crystal display, or other display. Display 14 may include a two-dimensional capacitive touch sensor or other touch sensor for gathering touch input. Display 14 may have a substrate formed from a flexible dielectric (e.g., a sheet of polyimide or other bendable polymer layer) and/or may have rigid substrate structures. Flexible display arrangements may be used to provide display 14 with the ability to alter size and shape by folding, scrolling, sliding, etc. If desired, some or all of display 14 may include rigid (non-flexible) display structures.

Devices 34 may include sensors 36. Sensors 36 may include force sensors (e.g., strain gauges, capacitive force sensors, resistive force sensors, etc.), audio sensors such as microphones, capacitive touch sensors, capacitive proximity sensors, non-capacitive touch sensors, ultrasonic sensors, sensors for detecting position, orientation, and/or motion (e.g., accelerometers, magnetic sensors such as compass sensors, gyroscopes, and/or inertial measurement units that contain some or all of these sensors), muscle activity sensors (EMG), heart rate sensors, electrocardiogram sensors, and other biometric sensors, radio-frequency sensors (e.g., radar and other ranging and positioning sensors), humidity sensors, moisture sensors, and/or other sensors.

Sensors 36 and other input-output devices 34 may include optical components such as light-emitting diodes (e.g., for camera flash or other blanket illumination, etc.), lasers such as vertical cavity surface emitting lasers and other laser diodes, laser components that emit multiple parallel laser beams (e.g., for three-dimensional sensing), lamps, and light sensing components such as photodetectors and digital image sensors. For example, sensors 36 in devices 34 may include optical sensors such as depth sensors (e.g., structured light sensors and/or depth sensors based on stereo imaging devices that can optically sense three-dimensional shapes), optical sensors such as self-mixing sensors and light detection and ranging (lidar) sensors that gather time-of-flight measurements and/or other measurements to determine distance between the sensor and an external object and/or that can determine relative velocity, monochromatic and/or color ambient light sensors that can measure ambient light levels, proximity sensors based on light (e.g., optical proximity sensors that include light sources such as infrared light-emitting diodes and/or lasers and corresponding light detectors such as infrared photodetectors that can detect when external objects are within a predetermined distance), optical sensors such as visual odometry sensors that gather position and/or orientation information using images gathered with digital image sensors in cameras, gaze tracking sensors, visible light and/or infrared cameras having digital image sensors configured to gather image data, optical sensors for measuring ultraviolet light, and/or other optical sensor components (e.g., light sensitive devices and, if desired, light sources), photodetectors coupled to light guides, associated light emitters, and/or other optical components (one or more light-emitting devices, one or more light-detecting devices, etc.).

Input-output devices 34 may also include audio components. The audio components may include one or more microphones to sense sound (e.g., an audio sensor in sensors 36 to sense audio signals) and may include sound-emitting components such as tone generators and one or more speakers. As shown in FIG. 2, for example, input-output devices 34 may include speaker 38. Speakers may be used to support speaker-phone operations and/or may be used as ear speakers when device 10 is being held to a user's ear to make a telephone call, to listen to a voicemail message, or to listen to other audio output.

In addition to sensors 36, display 14, and speaker 38, input-output devices 34 may include user input devices such as buttons and other devices 40. Devices 40 may include, for example, optical components such as light-based output devices other than display 14 that are used to provide visual output to a user. The light-based output devices may include one or more light-emitting diodes, one or more lasers, lamps, electroluminescent devices, and/or other light emitting components. Devices 40 may also include power transmitting and/or receiving circuits configured to transmit and/or receive wired and/or wireless power signals and output components such as haptic output devices and other output components (e.g., electromagnetic actuators or other actuators that can vibrate to provide a user with a haptic alert and/or haptic feedback associated with operation of a touch sensor or other input devices).

Figure 3:
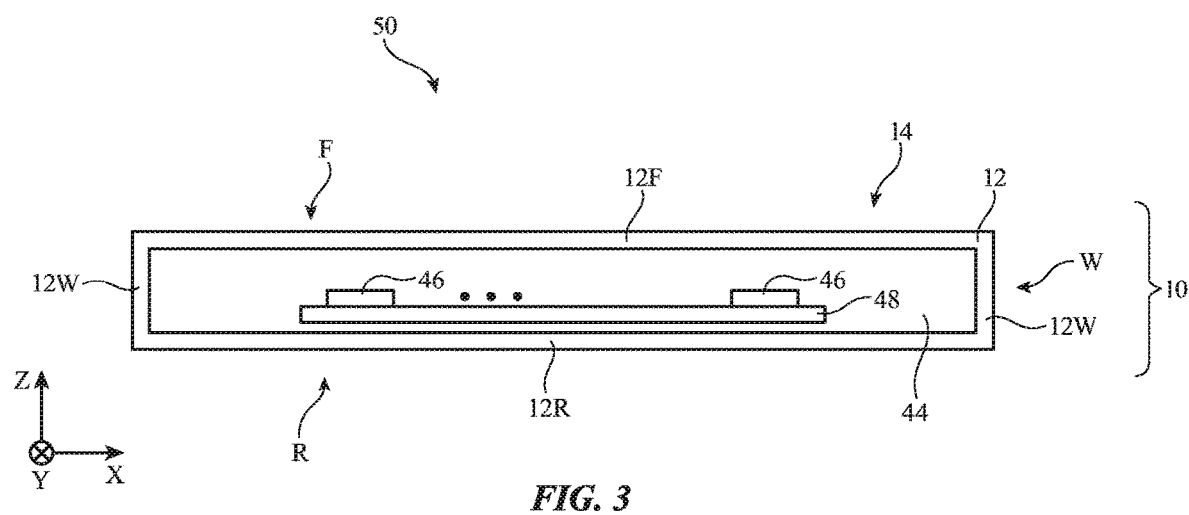
FIG. 3 is a cross-sectional side view of an illustrative electronic device in accordance with an embodiment.

A cross-sectional side view of device 10 taken along line 60 of FIG. 1 and viewed in direction 62 is shown in FIG. 3. As shown in FIG. 3, housing 12 may have one or more portions such as sidewall portions 12W, front portion 12F on front face F of device 10, and rear portion 12R on rear face R of device 10. These portions may be formed from metal (e.g., aluminum, stainless steel, or other metals) or may be formed from polymer, glass, ceramic, and/or other materials.

Display 14 may be visible on front face F of device 10 and/or other portions of device 10. For example, a viewer who is viewing device 10 in the −Z direction of FIG. 3 (e.g., a user viewing device 10 from the front) may view the pixels of display 14 on front face F that face the user in the +Z direction). Display 14 may be overlapped by transparent portions of housing 12, may have portions that are supported on the outermost surface of housing 12, and/or may have portions that protrude from housing 12. In some configurations, rigid protective transparent materials may form a display cover layer that protects display 14. To allow bending about bend axis 58 of FIG. 1, such rigid display cover layer structures may be provided in multiple parts (e.g., first and second parts that are supported by first and second respective halves of housing 12 that bend about a hinge aligned with axis 58). Display 14 may also be protected by attaching protective films to the outermost surface of display 14 and/or by incorporating protective films into display 14. As an example, a clear polymer film may overlap the pixels of display 14 to help protect the circuitry of the pixels from damage and/or thin-film organic and/or inorganic layers may be incorporated into display 14 to help protect display 14. In some arrangements, display 14 may include flexible protective material (e.g., a bendable polymer thin film, bendable inorganic thin-film layers, etc.). This allows the protective material to bend about bend axis 58. Transparent materials that overlap display 14 (e.g., to protect display 14) may be formed from sapphire or other crystalline material, glass, polymer, transparent ceramic, inorganic dielectric materials such as transparent metal oxide thin films and/or other inorganic materials, and/or other transparent material and/or other flexible and/or rigid transparent materials.

The walls of housing 12 may separate interior region 44 of device 10 from exterior region 50 surrounding device 10. Interior region 44 may include electrical components such as components 46. Components 46 may include integrated circuits, discrete components, a battery, wireless circuit components such as a wireless power coil, and/or other components (see, e.g., control circuitry 30, communications circuitry 32, and input-output devices 34 of FIG. 2). Components 46 may be interconnected using signal paths such as paths formed from traces on printed circuits (see, e.g., printed circuit 48).

Figure 4:
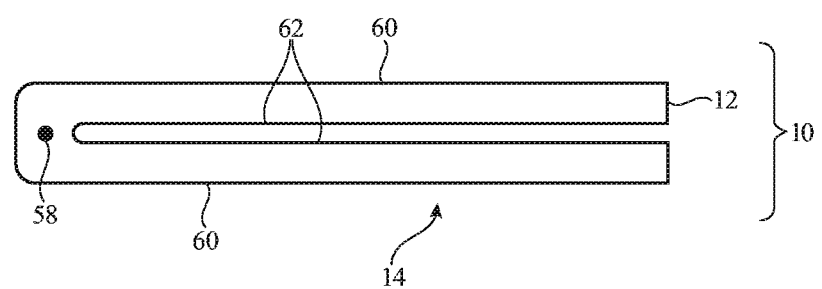
FIG. 4 is side view of an illustrative electronic device with a foldable display in accordance with an embodiment.

To accommodate the sometimes-competing desires for compact device size and large screen size, device 10 can be adjusted between a first state in which display 14 is unexpanded and a second state in which display 14 is expanded and therefore larger than when unexpanded. Device 10 may, for example, accommodate display bending. In an illustrative configuration, display 14 may be folded inwardly so that left and right halves of display 14 face each other. As shown in FIG. 4, when display 14 is formed on surface 63 of housing 12 of FIG. 4, first and second halves of display 14 may face each other when device 10 is folded inwardly. In another illustrative configuration, display 14 may be folded outwardly so that left and right halves of display 14 face away from each other (e.g., when display 14 is formed on surface 61 of housing 12 of FIG. 4). If desired, device 10 may support both inward and outward folding.

To allow device 10 to fold about bend (folding) axis 58, device 10 may have a hinge that is aligned with bend axis 58. The hinge may be formed from geared structures and/or other hinge structures that are coupled between respective first and second portions of device 10. The hinge may allow the first and second portions of device 10 to rotate relative to each other about bend axis 58.

Figure 5:
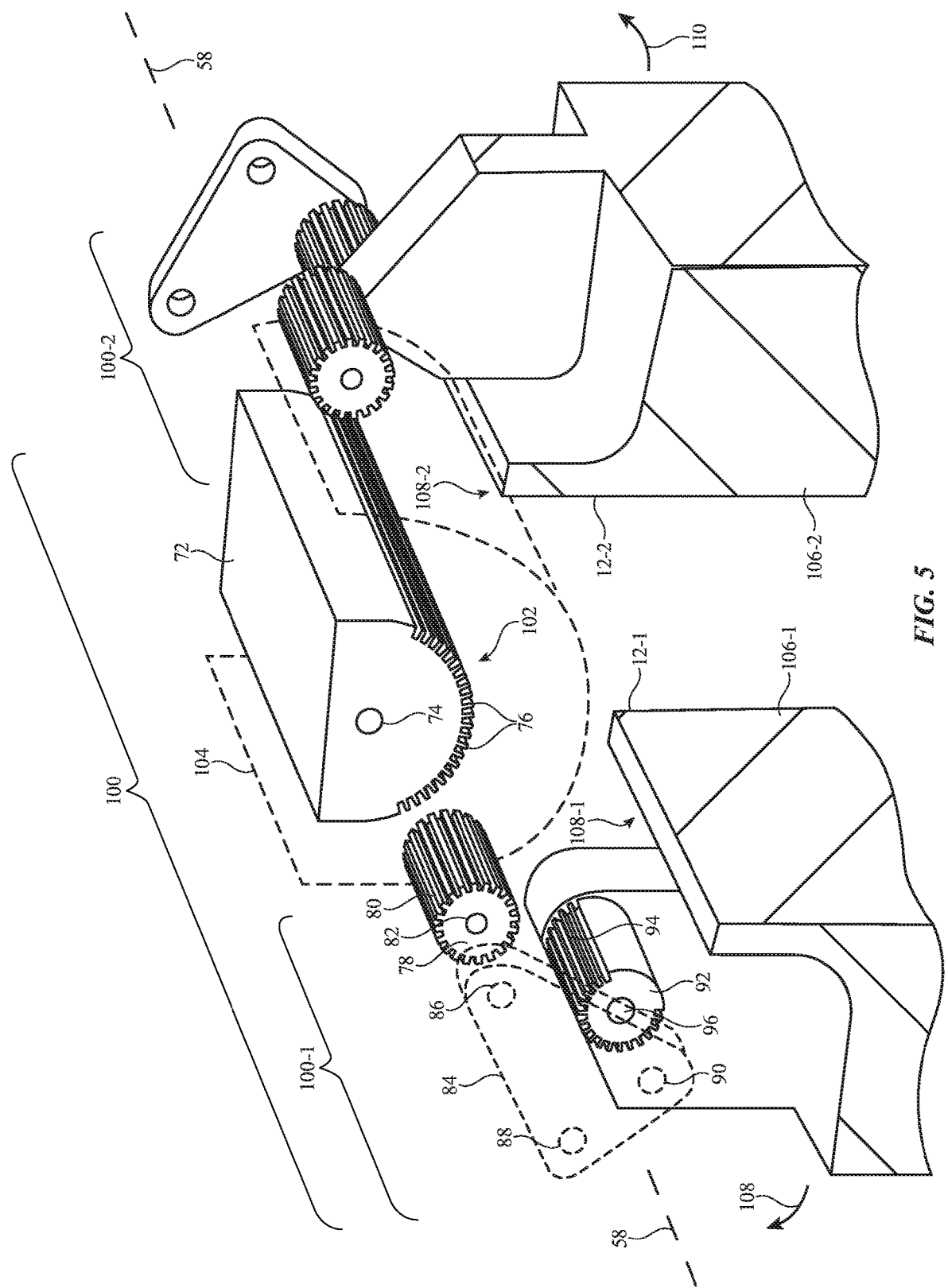
FIG. 5 is a perspective view of an illustrative hinge mechanism for an inwardly folding electronic device in accordance with an embodiment.

An exploded perspective view of an illustrative hinge is shown in FIG. 5. As shown in FIG. 5, one or more hinges such as hinge 100 may be coupled between one or more first housing portions such as first housing portion 12-1 and one or more second housing portions such as second housing portion 12-2. Display 14 may be a flexible display that has a first portion coupled to first housing portion 12-1 and a second portion coupled to second housing portion 12-2 to allow display bending as device 10 is bent about hinge axis 58.

Hinge 100 may have one or more structures such as first portion 100-1 to couple first housing portion 12-1 to rack member 72 and may have one or more structures such as second portion 100-2 to couple second housing portion 12-2 to rack member 72. Hinge 100 allows portions 12-1 and 12-2 and corresponding halves of a supported flexible display to rotate relative to each other. In the illustrative configuration of FIG. 5, device 10 is folded and portions 12-1 and 12-2 are folded and facing each other. When desired to unfold device 10, portion 12-1 may be moved in direction 108 while portion 12-2 is moved correspondingly in direction 110.

Rack member 72, which may sometimes be referred to as the hinge's central gear or a toothed hinge member, may have a geared surface such as toothed surface 102. Surface 120 may have a curved cross-sectional profile (e.g., the profile of surface 120 may follow an arc). Surface 102 may have teeth 76 and may be characterized by a radius of curvature (with respect to axis 70) of about 1-5 mm, 1-3 mm, at least 1 mm, less than 3 mm, less than 7 mm, less than 5 mm, or other suitable size.

Inverse gear 78 of first hinge portion 100-1 may have teeth 80 that engage teeth 76 in a first region of surface 120. The radius of gear 78 may be 0.8 mm, at least 0.4 mm, less than 1.2 mm, or other suitable size. A first pin may couple gear 78 to linkage member 84. The first pin may be received in opening 82 of gear 78 and opening 88 of linkage member 84. A second pin may be received in opening 74 of member 72 and opening 86 of member 84. A third pin may be received in opening 90 of linkage member 84 and opening 96 of satellite gear 92 (sometimes referred to as a fixed gear). The radius of gear 92 may be 0.8 mm, at least 0.4 mm, less than 1.2 mm, or other suitable size. The coupling pins that are used to couple the gears of hinge 100 are not shown in FIG. 5 to avoid over-complicating the drawing. Second hinge portion 100-2 may have the same structures as first hinge portion 100-1. For example, portion 100-2 may have a satellite gear with teeth that engage teeth 76 in a second region of surface 120, etc.

The ratio of the radius of gear 78 to the radius of gear 92 may be 1.0, at least 0.1, at least 0.5, at least 0.7, at least 1, less than 1.5, less than 2, less than 10, or other suitable ratio. The ratio of the radius of gear 78 to the radius of gear 92 may be 0.25, at least 0.02, at least 0.07, at least 0.15, less than 0.5, less than 1.0, less than 2.0, less than 10, less than 20, or other suitable ratio. The number of teeth of gear 78, gear 92, and member 72 may be 20, at least 3, at least 7, at least 10, at least 15, less than 200, less than 75, less than 30, or other suitable number. The width (e.g., the dimension parallel to axis 58 of FIG. 5) of gear 78, gear 92, and member 72 may each be between 1-100 mm, at least 0.5 mm, at least 1.5 mm, at least 5 mm, at least 10 mm, at least 50 mm, at least 100 mm, less than 500 mm, less than 50 mm, less than 25 mm, less than 4 mm, or other suitable width. Gear 78, gear 92, and member 72 may have teeth that fully overlap or that partially overlap (e.g., by less than 90%, less than 60%, less than 30%, or other suitable amount of partial overlap). The height of each tooth may be 0.1-10 mm, at least 0.2 mm, at least 0.5 mm, at least 1 mm, less than 20 mm, less than 10 mm, less than 3 mm, or other suitable size.

In hinge portion 100-1, a hinge structure retention member such as linkage member 84 holds the toothed structures of hinge 100 together during hinge operation. In particular, linkage member holds gear 78 against member 72 so that teeth 80 of gear 78 engage teeth 76 of member 72 as gear 78 walks along curved surface 102. Linkage member 84 also holds gear 78 against gear 92, so that teeth 80 engage teeth 94 of gear 92. Satellite gear 92 may be welded to housing portion 12-1 or otherwise fixedly attached to housing portion 12-1 (e.g., using adhesive, using fasteners, using structures that are formed integrally with portion 12-1, etc.). The gears of hinge portion 100-2 are coupled between member 72 and housing portion 12-2 in the same fashion. With this arrangement, gear 92 rotates with housing portion 12-1.

A flexible display may be mounted to surfaces 106-1 and 106-2 of portions 12-1 and 12-2, respectively. During operation, hinge 100 allows first housing portion 12-1 to rotate about bend axis 58 with respect to second housing portion 12-2. The outer perimeter of hinge 100 passes along curved surface 104. Tip portions 108-1 and 108-2 of portions 12-1 and 12-2 and/or nearby portions of an attached flexible display may be located at the effective pivoting points of the hinge. As a result, tip portions 108-1 and 108-2 rotate about these pivoting points during folding and unfolding. During operation, the flexible display that is attached to surfaces 106-1 and 106-2 therefore bends evenly without an excessively small bend radius or undesired stretching.

Figure 6:
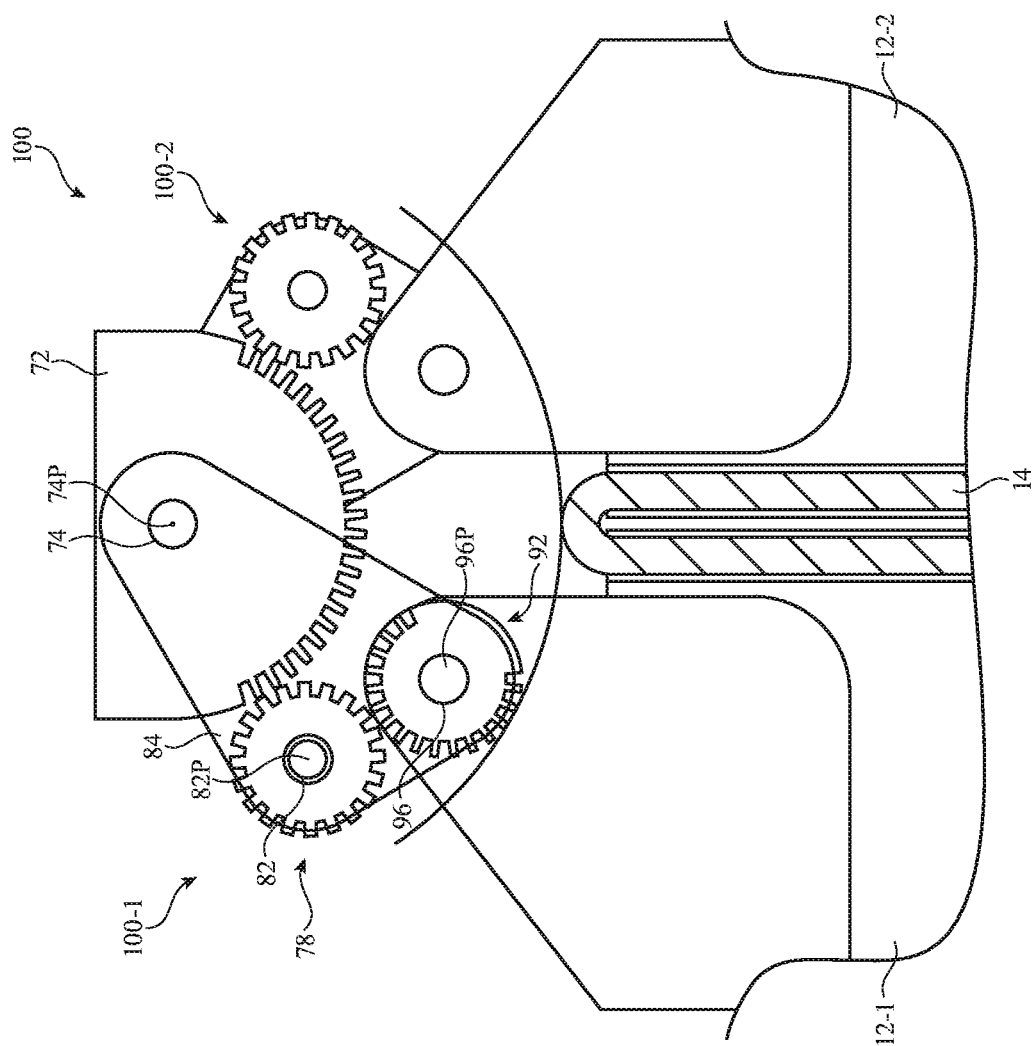
FIGS. 6, 7, and 8 are side views of the illustrative hinge mechanism of FIG. 5 in use during device folding in accordance with an embodiment.
Figure 7:
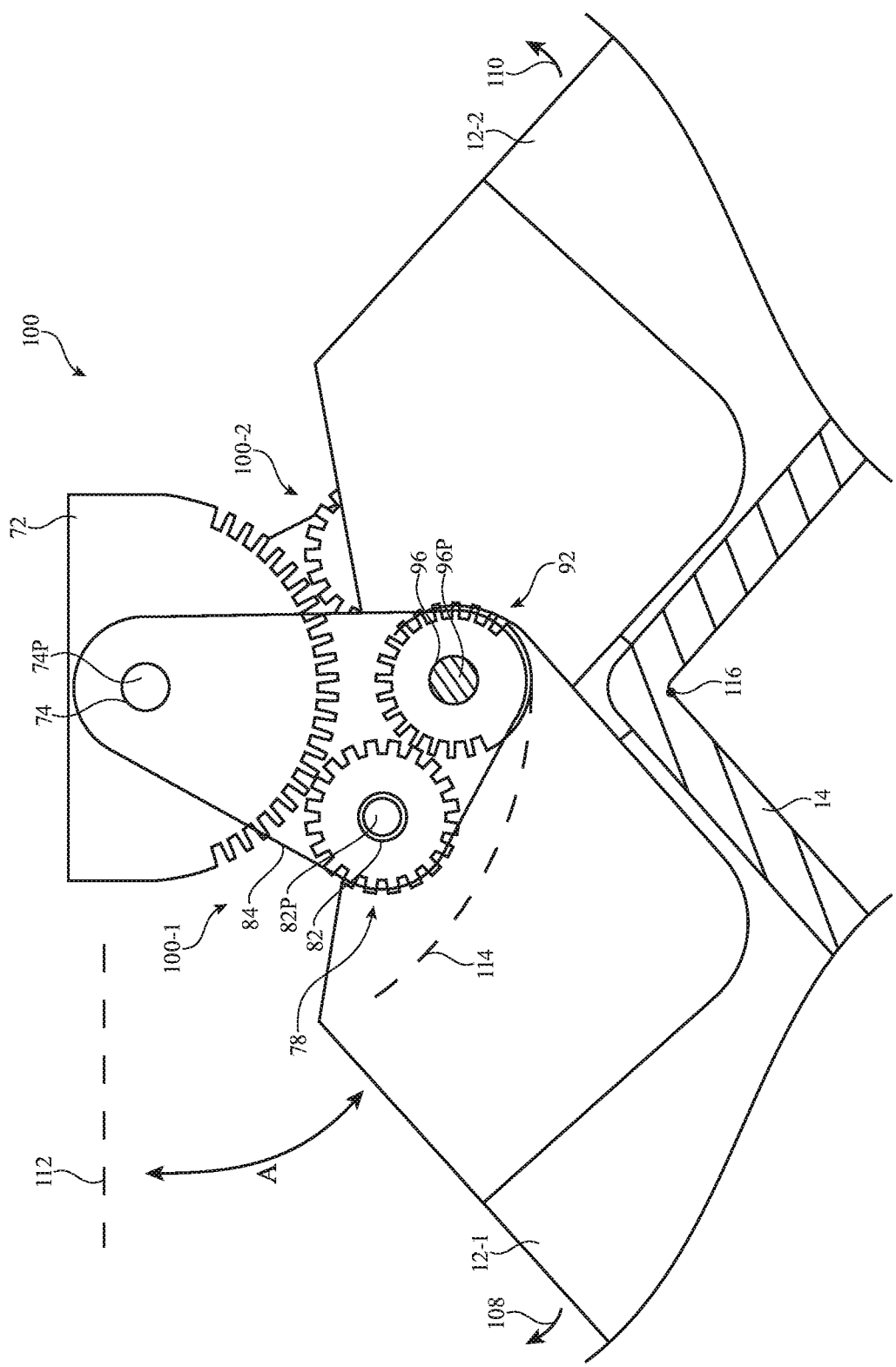
Figure 8:
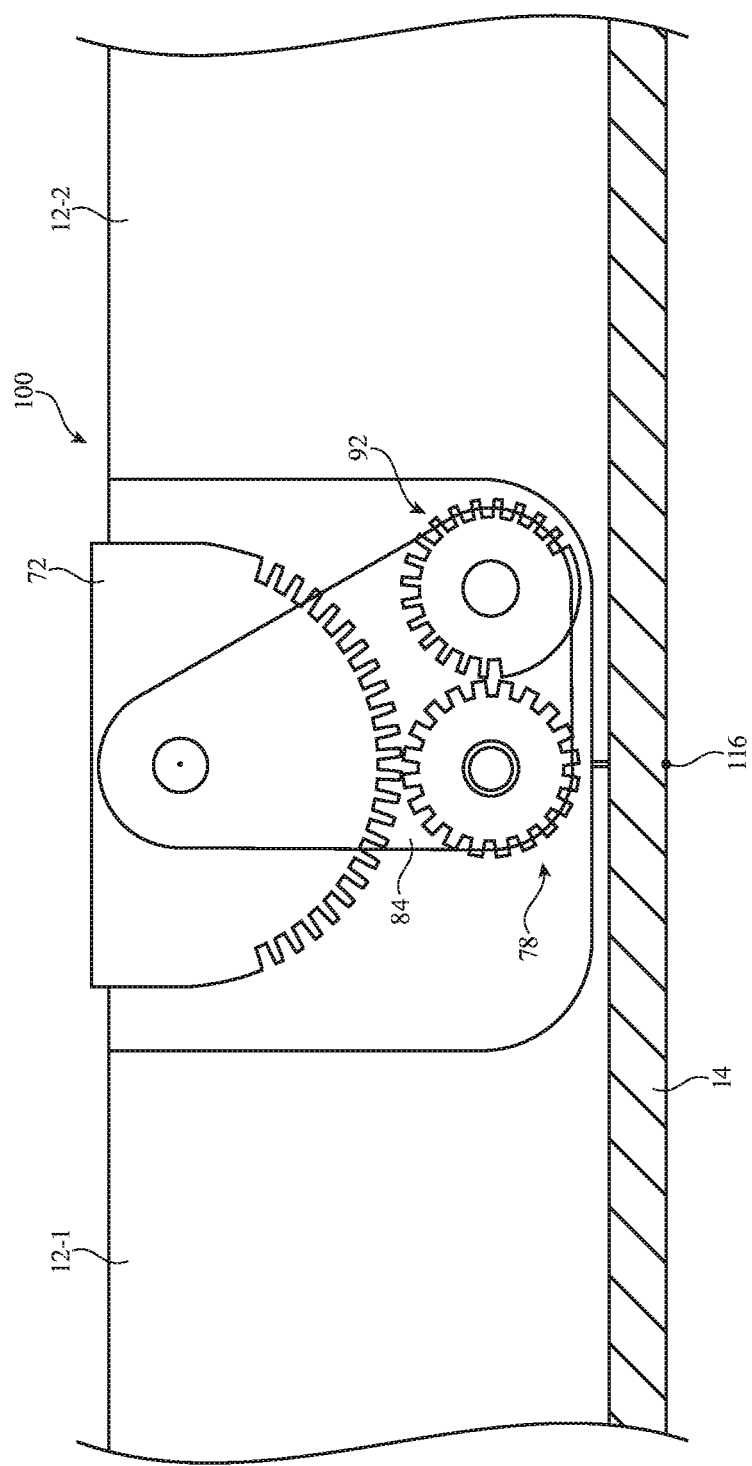

FIGS. 6, 7, and 8 are cross-sectional side views of hinge 100 showing how display 14 may bend during folding of device 10. In the configuration of FIG. 6, device 10 has been folded in half and display 14 has been bent 180° from its unfolded state. Portions 12-1 and 12-2 and corresponding surfaces 106-1 and 106-2 have retreated away from each other in the unfolded state to allow sufficient room for display 14 to bend without kinking. In the configuration of FIG. 7, housing portion 12-1 has been moved in direction 108 and housing portion 12-2 has been moved in direction 110 to begin to unfold device 10. During unfolding, linkage member 84 pivots about pin 74P in opening 74, gear 78 rotates about pin 82P in opening 82 while walking along the curved toothed surface of rack member 72. As gear 78 walks along the surface of rack member 72, pin 82P in opening 82 traces out an arc corresponding to the curved shape of the surface of rack member 72. Gear 92 is fixed to housing portion 12-1 and therefore does not rotate relative to housing portion 12-1. Linkage member 84 holds gear 78 in engagement with rack member 72 and holds gear 92 in engagement with gear 78. The engagement of gear 92 and gear 78 restricts the angle A of housing portion 12-1 and display 14 relative to horizontal axis 112 versus the location of a pivot point associated with gear 92 traveling along pivot point arc 114. When device 10 is completely unfolded, surfaces 106-1 and 106-2 are joined and form a continuous planar support surface for display 14 as shown in FIG. 8.

The ratio of gear 78 to gear 92 can be selected to help minimize undue stress in display 14 as display 14 is folded an unfolded. For example, this gear ratio can be selected so that the horizontal velocity component of a pivot point such as pivot point 116 is zero or nearly zero as device 10 is folded and unfolded. Pivot point 116 may be located at any suitable location relative to display 14. In a first embodiment, pivot point 116 is located on a surface of display 14. In a second embodiment, pivot point 116 is located within display 14. In a third embodiment, pivot point 116 is located away from the interior of display 14 and away from the surfaces of display 14 (e.g., pivot point 116 is separated from display 14).

Two opposing movement effects are balanced so as to cancel horizontal motion at pivot point 116 and thereby reduce display stress. A leftward horizontal relative motion of pivot point 116 with respect to pin 96P arises from the clockwise rotation of housing portion 12-1 as device 10 unfolds. An equal and opposite rightward horizontal motion of pivot point 116 arises during clockwise rotation of housing portion 12-1 as gear 78 rotates and walks counterclockwise to the right along rack member 72, thereby causing linkage member 84 to rotate counterclockwise so that gear 92 and pin 96P move to the right. By balancing these leftward and rightward motions, pivot points associated with flexible display 14 near the hinge of device 10 such as pivot 116 may remain horizontally stationary or nearly stationary as device 10 unfolds, thereby helping to reduce stress on display 14.

In the example of FIG. 5, surface 102 of rack member 72 has a circular arc shape and is characterized by a single hinge point. As shown in FIG. 6, there is a gap between the opposing surfaces of portions 12-1 and 12-2 when device 10 is in its folded configuration. With this arrangement, a left-hand pivot point (e.g., point 116) travels along a first axis that runs through opening 74 and a right-hand pivot point travels along a second axis that runs through opening 74 during folding and unfolding. The first and second axes are separated by a small non-zero angle.

Figure 9:
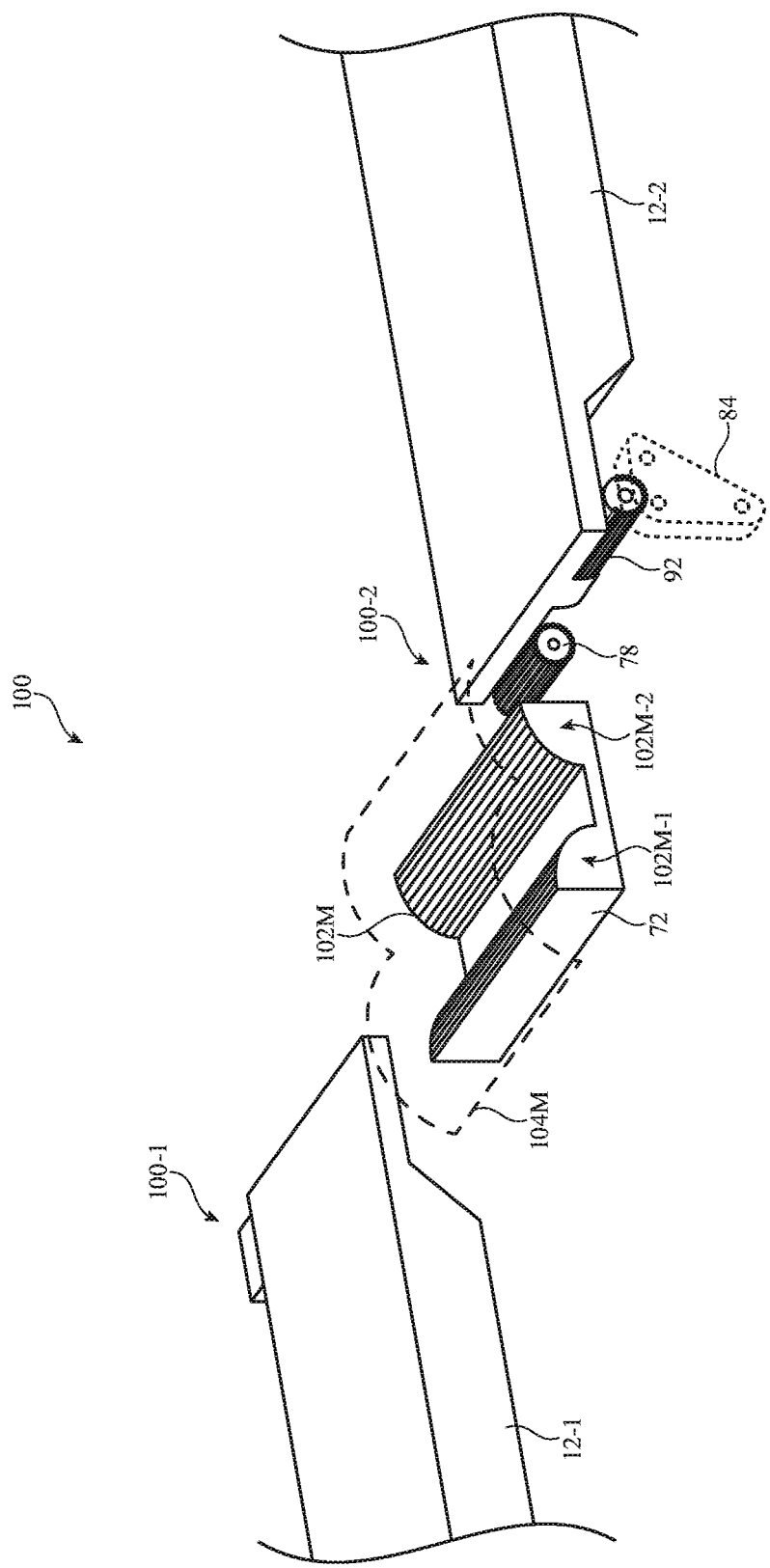
FIG. 9 is a perspective view of an illustrative hinge mechanism for an outwardly folding electronic device in accordance with an embodiment.

If desired, hinge 100 may be characterized by a double hinge point. As shown in FIG. 9, for example, each rack member 72 may have a toothed surface with multiple separate and distinct arcs as shown by multiply curved surface 102M of rack member 72 of FIG. 9. The arcs of the first and second curved surface regions 102M-1 and 102M-2 of member 72 are not part of a common arc shape as is the case in a single hinge point configuration of the type shown in FIG. 5. Hinge portion 100-1 may use the teeth of first region 102M-1 of surface 102M. Hinge portion 100-2 may use the teeth of second region 102M-2 of surface 102M.

The teeth of each curved rack member surface of FIG. 9 may be engaged by a respective one of rotating gears 78. A corresponding gear 92 may be fixedly attached to a portion of housing 12 (see, e.g., housing portion 12-2 in the example of FIG. 9). A linkage member 84 may be used to couple the gears and member 72 together as described in connection with FIG. 5.

Curved surface 104M of FIG. 9 serves as a visual indicator of the outer perimeter of hinge 100 during motion. With this type of arrangement, the left-hand pivot point of the hinge travels along a first axis that runs vertically and the right-hand pivot point of the hinge travels along a second axis that runs vertically, parallel to the first axis. There may be reduced amounts of horizontal pivot point motion and reduced amounts of stress imposed on display 14 during folding with this type of arrangement.

Figure 10:
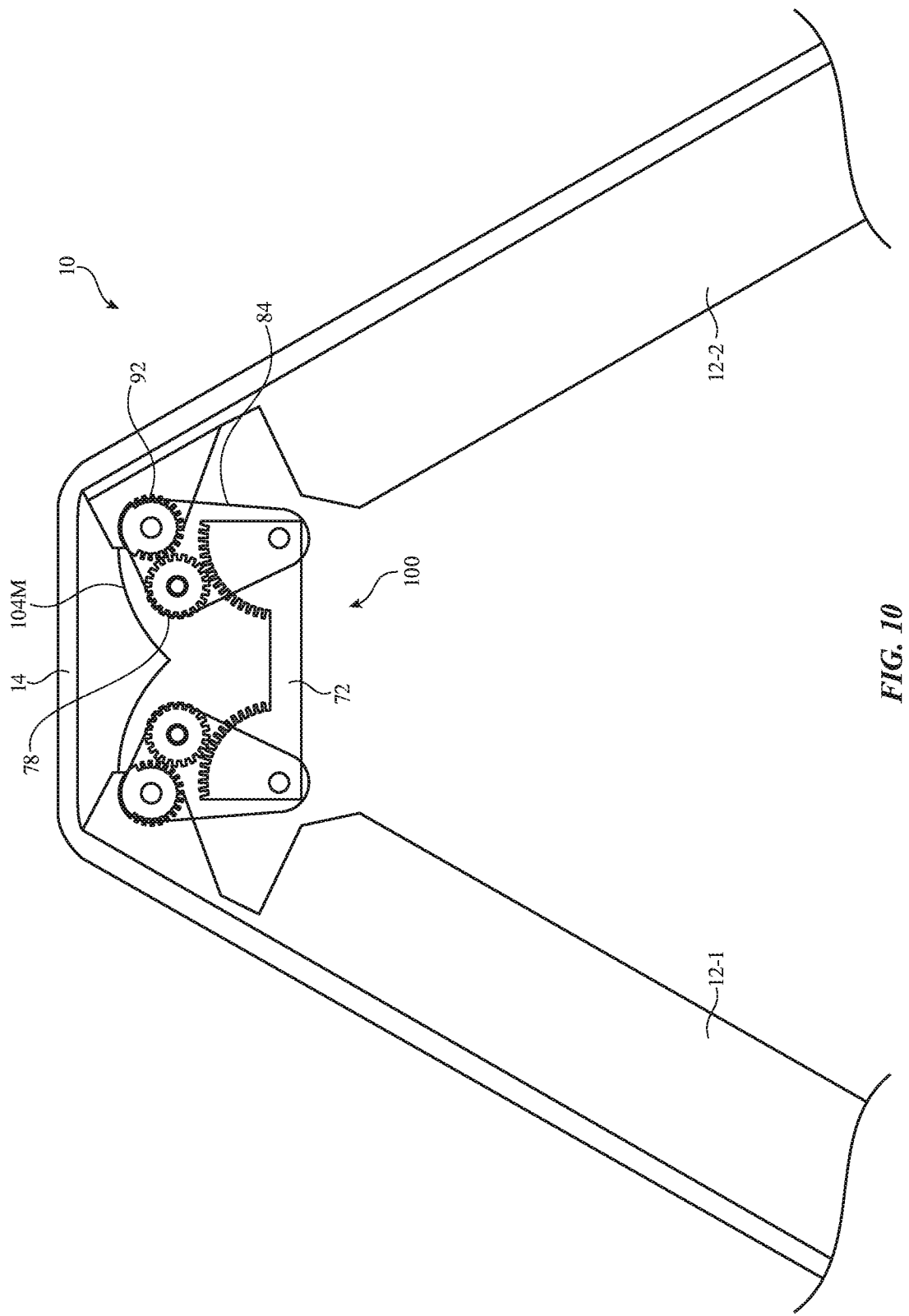
FIG. 10 is a side view of the illustrative hinge mechanism of FIG. 9 in use during device folding in accordance with an embodiment.

FIG. 10 is a cross-sectional side view of hinge 100 in an illustrative double hinge point configuration, showing how display 14 may be mounted on the outer surfaces of housing portions 12-1 and 12-2. In the illustrative configuration of FIG. 10, device 10 is an outwardly folding device in which first and second halves of display 14 face away from each other when device 10 is folded. Display 14 of FIG. 10 may be locally bent along two parallel axes (running into the page of FIG. 10) so that no one portion of display 14 exhibits more than a 90° bend. If desired, hinge structures such as hinge 100 (e.g., hinge 100 of FIG. 9) may be used to allow device 10 to fold inwardly and/or to fold both inwardly and outwardly.

Device 10 may be operated in a system that uses personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is illustrative and various modifications can be made to the described embodiments. The foregoing embodiments may be implemented individually or in any combination.

What is claimed is:

1. A foldable electronic device, comprising:
   a housing having a first housing portion and a second housing portion that rotate with respect to each other;
   a flexible display that overlaps the first and second housing portions; and
   a hinge coupled between the first and second housing portions, wherein
   the hinge includes a rack member and includes a first hinge portion and a second hinge portion each of which has a first gear, a second gear, and a linkage member that couples the first and second gears of that hinge portion to the rack member.

2. The foldable electronic device defined in claim 1 wherein the second gear of the first hinge portion is fixedly attached to the first housing portion and wherein the second gear of the second hinge portion is fixedly attached to the second housing portion.

3. The foldable electronic device defined in claim 2 wherein the rack member has rack member teeth that engage teeth on the first gear of the first hinge portion and that engage teeth on the first gear of the second hinge portion.

4. The foldable electronic device defined in claim 3 wherein the second gear of the first hinge portion has teeth that engage the teeth of the first gear of the first hinge portion and wherein the second gear of the second hinge portion has teeth that engage the teeth of the first gear of the second hinge portion.

5. The foldable electronic device defined in claim 1 wherein the flexible display comprises an organic light-emitting diode display with a first portion that is supported on a surface of the first housing portion and a second portion that is supported on a surface of the second housing portion.

6. A foldable electronic device, comprising:
   a first support structure;
   a second support structure;
   a flexible display that has a first portion supported by the first support structure and a second portion supported by the second support structure and that bends as the first and second support structures rotate relative to each other during folding and unfolding of the flexible display; and
   a hinge having a toothed member with a curved surface, wherein the hinge has a first hinge portion with first and second gears, wherein the first gear of the first hinge portion walks along the curved surface and has a second hinge portion with first and second gears, wherein the first gear of the second hinge portion walks along the curved surface.

7. The foldable electronic device defined in claim 6 wherein the second gear of the first hinge portion is coupled to the first support structure and does not rotate relative to the first support structure during the folding and unfolding of the flexible display and wherein the second gear of the second hinge portion is coupled to the second support structure and does not rotate relative to the second support structure during the folding and unfolding of the flexible display.

8. The foldable electronic device defined in claim 7 wherein the curved surface has a first portion that is curved along a first arc and has a second portion that is curved along a second arc that is distinct from the first arc.

9. The foldable electronic device defined in claim 7 wherein the curved surface forms a single continuous arc that engages the first gear of the first hinge portion and the first gear of the second hinge portion.

10. The foldable electronic device defined in claim 7 wherein the curved surface has first teeth in a first region that engage teeth on the first gear of the first hinge portion and has second teeth in a second region that engage teeth on the first gear of the second hinge portion.

11. The foldable electronic device defined in claim 10 wherein the first hinge portion has a first linkage member that holds the first gear of the first hinge portion against the first region and that holds the first gear against the second gear of the first hinge portion and wherein the second hinge portion has a second linkage member that holds the first gear of the second hinge portion against the second region and that holds the first gear of the second hinge portion against the second gear of the second hinge portion.

12. The foldable electronic device defined in claim 6 wherein the flexible display comprises an organic light-emitting diode display.

13. The foldable electronic device defined in claim 12 wherein the first gear of the first hinge portion and the first gear of the second hinge portion are rotatable gears.

14. The foldable electronic device defined in claim 13 wherein the second gear of the first hinge portion is attached to the first support structure and rotates with the first support structure and wherein the second gear second hinge portion is attached to the second support structure and rotates with the second support structure.

15. The foldable electronic device defined in claim 14 wherein the first hinge portion has a first linkage member and wherein the second hinge portion has a second linkage member.

16. The foldable electronic device defined in claim 15 wherein the first linkage member holds the first gear of the first hinge portion against the curved surface while the first gear of the first hinge portion walks along the curved surface and wherein the second linkage member holds the first gear of the second hinge portion against the curved surface while the first gear of the second hinge walks along the curved surface.

17. A foldable electronic device, comprising:
a housing having a first housing portion and a second housing portion that rotate with respect to each other;
a flexible display having a first portion that overlaps the first housing portion and a second portion that overlaps the second housing portion; and
a hinge with toothed structures, wherein the hinge has a first hinge portion coupled to the first housing portion and a second hinge portion coupled to the second housing portion, wherein the first hinge portion is configured to allow the flexible display to bend about a first pivot point as the first housing portion is rotated and wherein the second hinge portion is configured to allow the flexible display to bend about a second pivot point as the second housing portion is rotated.

18. The foldable electronic device defined in claim 17 wherein the toothed structures comprise: first and second gears in the first hinge portion and first and second gears in the second hinge portion.

19. The foldable electronic device defined in claim 18 wherein the toothed structures include a rack member with a curved surface and wherein the first gear of the first hinge portion and the first gear of the second hinge portion have teeth that engage teeth on the curved surface of the rack.

20. The foldable electronic device defined in claim 19 wherein the second gear of the first hinge portion is fixedly attached to the first housing portion and has teeth that engage the teeth of the first gear of the first hinge portion and wherein the second gear of the second hinge portion is fixedly attached to the second housing portion and has teeth that engage the teeth of the first gear of the second hinge portion.

21. A foldable electronic device, comprising:
a housing having a first housing portion and a second housing portion that rotate with respect to each other;
a flexible display having a first portion that overlaps the first housing portion and a second portion that overlaps the second housing portion; and
a hinge with toothed structures including a rack member with a curved surface, wherein the hinge is coupled between the first and second housing portions and is configured to allow the flexible display to bend about a pivot point as the first and second housing portions are rotated with respect to each other.

22. The foldable electronic device defined in claim 21 wherein the toothed structures comprise first and second gears in a first hinge portion and first and second gears in a second hinge portion, wherein a second gear of the first hinge portion is fixedly attached to the first housing portion, wherein the second gear of the second hinge portion is fixedly attached to the second housing portion, and wherein the second gear of the first hinge portion and the second gear of the second housing portion have teeth that engage teeth on the curved surface of the rack.

* * * * *